(12) United States Patent
Kishimoto et al.

(10) Patent No.: US 11,513,643 B2
(45) Date of Patent: *Nov. 29, 2022

(54) ORGANIC ELECTROLUMINESCENT DISPLAY DEVICE AND METHOD FOR PRODUCING SAME

(71) Applicant: SAKAI DISPLAY PRODUCTS CORPORATION, Sakai (JP)

(72) Inventors: Katsuhiko Kishimoto, Sakai (JP); Yozo Narutaki, Sakai (JP)

(73) Assignee: SAKAI DISPLAY PRODUCTS CORPORATION, Sakai (JP)

(*) Notice: Subject to any disclaimer, the term of this patent is extended or adjusted under 35 U.S.C. 154(b) by 1 day.

This patent is subject to a terminal disclaimer.

(21) Appl. No.: 17/116,580

(22) Filed: Dec. 9, 2020

(65) Prior Publication Data

US 2021/0103358 A1   Apr. 8, 2021

Related U.S. Application Data

(63) Continuation of application No. 16/606,639, filed as application No. PCT/JP2017/025591 on Jul. 13, 2017, now Pat. No. 10,897,027.

(51) Int. Cl.
*H01L 27/32* (2006.01)
*G06F 3/044* (2006.01)
(Continued)

(52) U.S. Cl.
CPC .......... *G06F 3/0443* (2019.05); *G06F 3/0412* (2013.01); *H01L 27/323* (2013.01);
(Continued)

(58) Field of Classification Search
CPC ............. H01L 27/3246; H01L 27/3272; H01L 27/3276–3279; H01L 51/5253–5256
See application file for complete search history.

(56) References Cited

U.S. PATENT DOCUMENTS

| 10,897,027 B2* | 1/2021 | Kishimoto ............. H05B 33/04 |
| 2004/0046184 A1 | 3/2004 | Yanagawa et al. |

(Continued)

FOREIGN PATENT DOCUMENTS

| JP | 2000-068050 A | 3/2000 |
| JP | 2004-103534 A | 4/2004 |

(Continued)

OTHER PUBLICATIONS

Notice of Allowance of U.S. Appl. No. 16/606,639 dated Sep. 23, 2020.

*Primary Examiner* — Daniel P Shook
(74) *Attorney, Agent, or Firm* — ScienBiziP, P.C.

(57) ABSTRACT

According to an embodiment of the invention, the organic EL device (100) comprises: an element substrate (20) having a substrate (1) and a plurality of organic EL elements (3) supported by the substrate; a thin film encapsulation structure (10) formed above the plurality of organic EL elements and having at least one compound layered body (10S) constituted by a first inorganic barrier layer (12), an organic barrier layer (14) in contact with the upper surface of the first inorganic barrier layer and having a plurality of solid sections spread out discretely, and a second inorganic barrier layer (16) in contact with the upper surface of the first inorganic barrier layer and the upper surfaces of the plurality of solid sections of the organic barrier layer; an organic planarization layer (42) provided above the thin film encapsulation structure and formed from a photosensitive resin; and a touch sensor layer (50) disposed above the organic planarization layer.

12 Claims, 9 Drawing Sheets

(51) Int. Cl.
    *G06F 3/041* (2006.01)
    *H01L 51/00* (2006.01)
    *H01L 51/52* (2006.01)
    *H01L 51/56* (2006.01)
    *G06F 3/045* (2006.01)

(52) U.S. Cl.
    CPC ...... *H01L 27/3276* (2013.01); *H01L 51/0097* (2013.01); *H01L 51/5253* (2013.01); *H01L 51/56* (2013.01); *G06F 3/045* (2013.01); *G06F 3/0446* (2019.05); *G06F 2203/04102* (2013.01); *H01L 2227/323* (2013.01); *H01L 2251/5338* (2013.01)

(56) References Cited

U.S. PATENT DOCUMENTS

| | | |
|---|---|---|
| 2010/0007616 A1 | 1/2010 | Jang |
| 2012/0268402 A1 | 10/2012 | Wang et al. |
| 2015/0035001 A1 | 2/2015 | Yamazaki et al. |
| 2016/0043346 A1 | 2/2016 | Kamiya et al. |
| 2016/0087023 A1 | 3/2016 | Maeda |
| 2016/0126495 A1 | 5/2016 | Oka et al. |
| 2016/0226021 A1 | 8/2016 | Lee et al. |
| 2017/0092896 A1* | 3/2017 | Nakamura .......... H01L 51/5256 |
| 2017/0141330 A1 | 5/2017 | Tsunoi et al. |
| 2017/0194404 A1 | 7/2017 | Park et al. |

FOREIGN PATENT DOCUMENTS

| | | |
|---|---|---|
| JP | 2012-156140 A | 8/2012 |
| JP | 2013-064187 A | 4/2013 |
| JP | 2013-186971 A | 9/2013 |
| JP | 2015-046385 A | 3/2015 |
| JP | 2016-039120 A | 3/2016 |
| JP | 2016-062874 A | 4/2016 |
| JP | 2017-068928 A | 4/2017 |
| JP | 2017-095458 A | 6/2017 |
| JP | 2017-120775 A | 7/2017 |
| WO | 2014/196137 A1 | 12/2014 |

* cited by examiner

ORGANIC ELECTROLUMINESCENT DISPLAY DEVICE AND METHOD FOR PRODUCING SAME

TECHNICAL FIELD

The present invention relates to an organic EL device (e.g., organic EL display device and organic EL illumination device) and a method for producing the same.

BACKGROUND ART

Organic EL (Electroluminescence) display devices start being put into practical use. One feature of an organic EL display device is flexibility thereof. Such an organic EL display device includes, in each of pixels, at least one organic EL element (Organic Light Emitting Diode: OLED) and at least one TFT (Thin Film Transistor) controlling an electric current to be supplied to the at least one OLED. Hereinafter, an organic EL display device will be referred to as an "OLED display device". Such an OLED display device including a switching element such as a TFT or the like in each of OLEDs is called an "active matrix OLED display device". A substrate including the TFTs and the OLEDs will be referred to as an "element substrate".

An OLED (especially, an organic light emitting layer and a cathode electrode material) is easily influenced by moisture to be deteriorated and to cause display unevenness. One technology developed to provide an encapsulation structure that protects the OLED against moisture while not spoiling the flexibility of the OLED display device is a thin film encapsulation (TFE) technology. According to the thin film encapsulation technology, an inorganic barrier layer and an organic barrier layer are stacked alternately to allow such thin films to provide a sufficient level of water vapor barrier property. From the point of view of the moisture-resistance reliability of the OLED display device, such a thin film encapsulation structure is typically required to have a WVTR (Water Vapor Transmission Rate) lower than, or equal to, $1 \times 10^{-4}$ g/m²/day.

A thin film encapsulation structure used in OLED display devices commercially available currently includes an organic barrier layer (polymer barrier layer) having a thickness of about 5 μm to about 20 μm. Such a relatively thick organic barrier layer also has a role of flattening a surface of the element substrate. However, such a thick organic barrier layer involves a problem of limiting the bendability of the OLED display device.

There is also a problem that the mass-productivity is low. The relatively thick organic barrier layer described above is formed by use of a printing technology such as an inkjet method, a microjet method or the like. By contrast, an inorganic barrier layer is formed by a thin film formation technology in a vacuum atmosphere (e.g., lower than, or equal to, 1 Pa). The formation of the organic barrier layer by use of a printing method is performed in the air or a nitrogen atmosphere, whereas the formation of the inorganic barrier layer is performed in vacuum. Therefore, the element substrate is put into, and out of, a vacuum chamber during the formation of the thin film encapsulation structure, which decreases the mass-productivity.

Under such a situation, as disclosed in, for example, Patent Document No. 1, a film formation device capable of producing an inorganic barrier layer and an organic barrier layer continuously has been developed.

Patent Document No. 2 discloses a thin film encapsulation structure including a first inorganic material layer, a first resin member and a second inorganic material layer provided on the element substrate in this order, with the first inorganic barrier layer being closest to the element substrate. In this thin film encapsulation structure, the first resin member is present locally, more specifically, in the vicinity of a protruding portion of the first inorganic material layer (first inorganic material layer covering the protruding portion). According to Patent Document No. 2, since the first resin member is present locally, more specifically, in the vicinity of the protruding portion, which may not be sufficiently covered with the first inorganic material layer, entrance of moisture or oxygen via the non-covered portion is suppressed. In addition, the first resin member acts as an underlying layer for the second inorganic material layer. Therefore, the second inorganic material layer is properly formed and properly covers a side surface of the first inorganic material layer with an expected thickness. The first resin member is formed as follows. An organic material heated and vaporized to be mist-like is supplied onto an element substrate maintained at a temperature lower than, or equal to, room temperature. The organic material is condensed and put into liquid drops on the substrate. The organic material in the liquid drops moves on the substrate by a capillary action or a surface tension to be present locally, more specifically, at a border between a side surface of the protruding portion of the first inorganic material layer and a surface of the substrate. Then, the organic material is cured to form the first resin member at the border. Patent Document No. 3 also discloses an OLED display device including a similar thin film encapsulation structure. Patent Document No. 4 discloses a film formation device usable to produce an OLED display device.

The thin film encapsulation structure that is described in each of Patent Documents Nos. 2 and 3 and includes an organic barrier layer formed of a resin located locally does not include a thick organic barrier layer. Therefore, the thin film encapsulation structure is considered to improve the bendability of the OLED display device. In addition, since the inorganic barrier layer and the organic barrier layer may be formed continuously, the mass-productivity is also improved.

However, according to the studies made by the present inventors, an organic barrier layer formed by the method described in Patent Document No. 2 or 3 has a problem of not providing a sufficiently high level of moisture-resistance reliability. This problem has been found to be caused because water vapor in the air reaches the inside of an active region on the element substrate (the active region may also be referred to as an "element formation region" or a "display region") via the organic barrier layer.

In the case where an organic barrier layer is formed by use of a printing method such as an inkjet method or the like, it is possible to form the organic barrier layer only in an active region on the element substrate (the active region may also be referred to as an "element formation region" or a "display region") but not in a region other than the active region. In this case, along a periphery of the active region (outer to the active region), there is a region where the first inorganic material layer and the second inorganic material layer are in direct contact with each other, and the organic barrier layer is fully enclosed by the first inorganic material layer and the second inorganic material layer and is insulated from the outside of the first inorganic material layer and the second inorganic material layer.

By contrast, according to the method for forming the organic barrier layer described in Patent Document No. 2 or 3, a resin (organic material) is supplied to the entire surface of the element substrate, and the surface tension of the resin, which is in a liquid state, is used to locate the resin locally, more specifically, at the border between the surface of the element substrate and the side surface of the protruding portion on the surface of the element substrate. Therefore, the organic barrier layer may also be formed in a region other than the active region (the region other than the active region may also be referred to as a "peripheral region"), namely, a terminal region where a plurality of terminals are located and a lead wire region where lead wires extending from the active region to the terminal region are formed. Specifically, the resin is present locally, more specifically, at, for example, the border between side surfaces of the lead wires or side surfaces of the terminals and the surface of the substrate. In this case, an end of a portion, of the organic barrier layer, that is formed along the lead wires is not enclosed by the first inorganic barrier layer or the second inorganic barrier layer, but is exposed to the air (ambient atmosphere).

The organic barrier layer is lower in the water vapor barrier property than the inorganic barrier layer. Therefore, the organic barrier layer formed along the lead wires acts as a route that leads the water vapor in the air to the active region.

The conventional thin film encapsulation structure including an organic barrier layer formed of a resin located locally also involves the following problem.

For example, as described in Patent Document No. 5, in an OLED display device having a touch panel function that is used for a smartphone or a tablet terminal, an organic barrier layer in a thin film encapsulation structure is relatively thick and acts as a flattening layer. A touch sensor layer (also referred to as a "touch screen layer") is provided on a flat surface of the thin film encapsulation structure while an adhesive layer is located between the touch sensor layer and the flat surface. In the case where a thin film encapsulation structure on which the touch sensor layer is provided includes a relatively thin organic barrier layer described in Patent Document No. 2 or 3, the following problem occurs. In the case where a particle (foreign object) is present in the thin film encapsulation structure, the top surface of the thin film encapsulation structure is made non-flat. Therefore, the touch sensor layer is strained, and as a result, the touch panel function may be deteriorated. For example, in a touch sensor of a resistive film system, which has a microscopic gap between a pair of electrodes, and in a touch sensor of a projected capacitive system, which detects a change in the capacitance between electrodes, a site where such a particle is present may be erroneously detected as a touched position.

In the above, some problems of a thin film encapsulation structure preferably usable for a flexible OLED display device is described. The thin film encapsulation structure is not limited to being used for an OLED display device, and is also usable for other types of organic EL devices such as an organic EL illumination device and the like.

CITATION LIST

Patent Literature

Patent Document No. 1: Japanese Laid-Open Patent Publication No. 2013-186971
Patent Document No. 2: WO2014/196137
Patent Document No. 3: Japanese Laid-Open Patent Publication No. 2016-39120
Patent Document No. 4: Japanese Laid-Open Patent Publication No. 2013-64187
Patent Document No. 5: United States Patent Application Publication No. 2016/226021

SUMMARY OF INVENTION

Technical Problem

The present invention, made to solve the above-described problems, has an object of providing an organic EL device including a thin film encapsulation structure that includes a relatively thin organic barrier layer, by which the mass-productivity and the moisture-resistance reliability are improved and deterioration of a touch panel function is suppressed, and also providing a method for producing the same.

Solution to Problem

An organic EL device according to an embodiment of the present invention includes an element substrate including a substrate and a plurality of organic EL elements supported by the substrate; a thin film encapsulation structure formed on the plurality of organic EL elements, the thin film encapsulation structure including at least one composite stack body that includes a first inorganic barrier layer, an organic barrier layer including a plurality of solid portions in contact with a top surface of the first inorganic barrier layer and distributed discretely, and a second inorganic barrier layer in contact with the top surface of the first inorganic barrier layer and top surfaces of the plurality of solid portions of the organic barrier layer; an organic flattening layer provided on the thin film encapsulation structure and formed of a photosensitive resin; and a touch sensor layer located on the organic flattening layer. A "solid portion" refers to a portion, of the organic barrier layer, where an organic film (e.g., photocured resin film) is actually present. By contrast, a portion, of the organic barrier layer, where the organic film is absent is referred to as a "non-solid portion". The non-solid portion enclosed by the solid portion may also be referred to as an "opening".

In an embodiment, the plurality of solid portions included in the organic barrier layer include a plurality of solid portions each having a recessed surface.

In an embodiment, the organic barrier layer is formed of a photocured resin (obtained by curing a photocurable resin). The photocurable resin is preferably an ultraviolet-curable resin, and an acrylic resin (acrylic monomer (encompassing an acrylic oligomer)) is preferably usable.

In an embodiment, the first and second inorganic barrier layers are each independently an $SiN_x$ layer having a thickness of 200 nm or greater and 1000 nm or less.

In an embodiment, the photosensitive resin is of a negative type.

In an embodiment, the organic flattening layer has a thickness that does not exceed 15 m. The organic flattening layer has a thickness of, for example, 3 m or greater.

In an embodiment, the photosensitive resin contains a silicone resin. The photosensitive resin may be an acrylic resin.

In an embodiment, the organic flattening layer has a transmittance of 80% or higher to light having a wavelength of 350 nm.

In an embodiment, the photosensitive resin has an elastic modulus that does not exceed 400 MPa at 0° C.

In an embodiment, the organic EL device further includes an inorganic insulating layer covering the organic flattening layer. The touch sensor layer is formed on the inorganic insulating layer. The inorganic insulating layer is, for example, an $SiN_x$ layer. The $SiN_x$ layer has a thickness of, for example, 200 nm or greater and 1000 nm or less.

In an embodiment, the organic flattening layer covers at least the entirety of an active region in which the plurality of organic EL elements are located, and is formed in a range larger than a range of the tough sensor layer.

In an embodiment, the organic flattening layer covers the entirety of the element substrate.

In an embodiment, the organic EL device further includes a driving circuit supported by the substrate, a plurality of terminals located in a peripheral region, and a plurality of lead wires connecting the driving circuit and the plurality of terminals to each other. The thin film encapsulation structure is provided on a portion, of each of the plurality of lead wires, that is closer to the driving circuit, and includes an inorganic barrier layer joint portion where no organic barrier layer is present and the first inorganic barrier layer and the second inorganic barrier layer are in direct contact with each other, the inorganic barrier layer joint portion being provided on the portion of each of the plurality of lead wires. In a cross-section of each of the plurality of lead wires that is taken along a plane parallel to a line width direction thereof, a side surface of the lead wire preferably has a tapering angle smaller than 90 degrees, and a side surface of the first inorganic barrier layer preferably has a tapering angle smaller than 70 degrees. It is preferred that the inorganic barrier layer joint portion has a length of at least 0.01 mm.

A method for producing an organic EL device according to an embodiment of the present invention is a method for producing any one of the above-described organic EL devices. A step of forming the organic flattening layer includes step A of preparing the element substrate on which the thin film encapsulation structure is formed; step B of applying a liquid containing a negative-type photosensitive resin to the element substrate such that the liquid covers at least the thin film encapsulation structure; and step C of irradiating the entirety of the photosensitive resin on the element substrate with light.

In an embodiment, the step B is a step of applying the liquid to only a predetermined region on the element substrate. The step B may be performed by, for example, a known printing method (e.g., an inkjet method and a screen printing method).

A method for producing an organic EL device according to an embodiment of the present invention is a method for producing any one of the above-described organic EL devices. A step of forming the organic flattening layer includes step A of preparing the element substrate on which the thin film encapsulation structure is formed; step B of applying a liquid containing a photosensitive resin to the element substrate such that the liquid covers at least the thin film encapsulation structure; step C of selectively irradiating a portion, of the photosensitive resin, that is in a predetermined region on the element substrate or in a region other than the predetermined region, with light; and step D of putting the photosensitive resin into contact with a developer after the step C. The step B may be a step of applying the liquid containing the photosensitive resin to the entirety of the element substrate. In this case, the method may include a step of connecting an external substrate with the plurality of terminals of the element substrate may be provided before the step B.

In an embodiment of the present invention, a step of forming the at least one composite stack body includes the steps of preparing, in a chamber, the element substrate on which the first inorganic barrier layer is formed; supplying a vapor-like or mist-like photocurable resin into the chamber; condensing the photocurable resin on the first inorganic barrier layer to form a liquid film; irradiating the liquid film formed of the photocurable resin with light to form a photocured resin layer; and partially ashing the photocured resin layer to form the organic barrier layer. The thickness of the liquid film and/or the conditions of ashing may be adjusted to adjust the region in which the photocured resin is to be left and the thickness of the photocured resin.

In an embodiment, the ashing is performed by plasma ashing using, for example, at least one type of gas among $N_2O$, $O_2$ and $O_3$.

In an embodiment of the present invention, a step of forming the at least one composite stack body may include a step of forming the organic barrier layer by the method described in Patent Document No. 2 or 3. According to such a method, a photocured resin may be located locally, more specifically, at a border between a side surface of a protruding portion and a flat portion of the first inorganic barrier layer (making a tapering angle of 90 degrees or larger). In a cross-section of each of the plurality of lead wires that is taken along a plane parallel to a line width direction thereof, a side surface of the lead wire preferably has a tapering angle smaller than 90 degrees, and a side surface of the first inorganic barrier layer preferably has a tapering angle smaller than 70 degrees.

Advantageous Effects of Invention

An embodiment of the present invention provides an organic EL device including a thin film encapsulation structure that includes a relatively thin organic barrier layer, by which the mass-productivity and the moisture-resistance reliability are improved and deterioration of a touch panel function is suppressed, and also provides a method for producing the same.

BRIEF DESCRIPTION OF DRAWINGS

FIG. 4A is a cross-sectional view taken along line 4A-4A' in FIG. 3A, FIG. 4B is a cross-sectional view taken along line 4B-4B' in FIG. 3A, and FIG. 4C is a cross-sectional view taken along line 4C-4C' in FIG. 3A.

DESCRIPTION OF EMBODIMENTS

Hereinafter, an organic EL device and a method for producing the same according to embodiments of the present invention will be described with reference to the drawings. The embodiments of the present invention are not limited to those described below as examples.

Figure 1A:
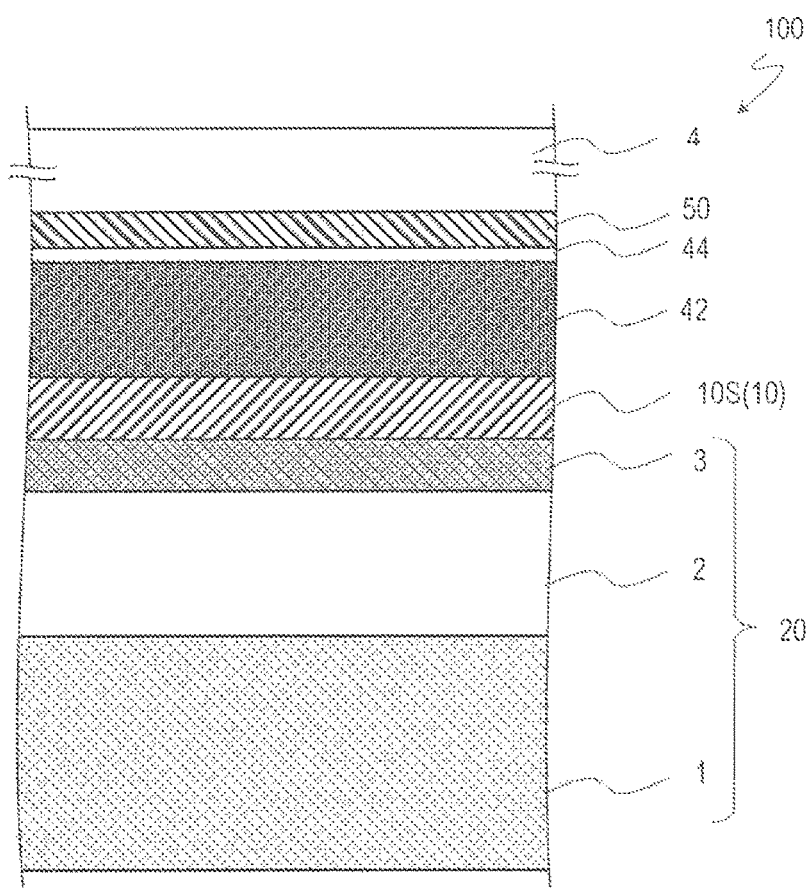
FIG. 1A is a schematic partial cross-sectional view of an active region of an OLED display device 100 according to an embodiment of the present invention.
Figure 1B:
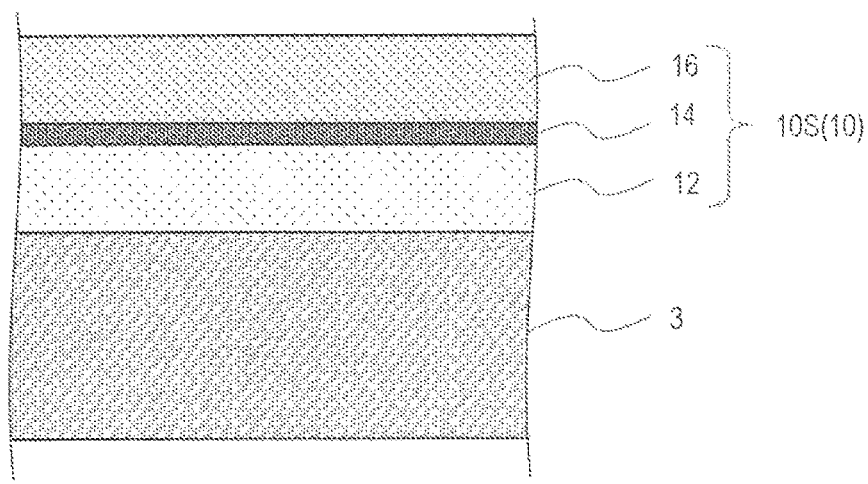
FIG. 1B is a partial cross-sectional view of a TFE structure 10 formed on an OLED 3.

With reference to FIG. 1A and FIG. 1B, a basic structure of an OLED display device 100 according to an embodiment of the present invention will be described. FIG. 1A is a schematic partial cross-sectional view of an active region of the OLED display device 100 according to an embodiment of the present invention. FIG. 1B is a partial cross-sectional view of a TFE structure 10 formed on an OLED 3.

The OLED display device 100 includes a plurality of pixels, and each of the pixels includes at least one organic EL element (OLED). Herein, a structure corresponding to one OLED will be described for the sake of simplicity.

As shown in FIG. 1A, the OLED display device 100 includes a flexible substrate (hereinafter, may be referred to simply as a "substrate") 1, a circuit (backplane) 2 formed on the substrate 1 and including a TFT, the OLED 3 formed on the circuit 2, and the TFE structure 10 formed on the OLED 3. The OLED 3 is, for example, of a top emission type. An uppermost portion of the OLED 3 is, for example, a top electrode or a cap layer (refractive index adjusting layer). The OLED display device 100 further includes an organic flattening layer 42 provided on the thin film encapsulation structure 10 and formed of a photosensitive resin, an inorganic insulating layer 44 covering the organic flattening layer 42, and a touch sensor layer 50 located on the inorganic insulating layer 44. The inorganic insulating layer 44 may be omitted. An optional polarizing plate 4 is located on the touch sensor layer 50. The polarizing plate 4 may be located between the TFE structure 10 and the touch sensor layer 50 (e.g., between the organic flattening layer 42 and the touch sensor layer 50). The polarizing plate 4 is a circularly polarizing plate (stack body of a linearly polarizing plate and a λ/4 plate), and plays a role of preventing reflection as is well known. From the point of view of preventing reflection, it is preferred that the polarizing plate 4 is located on the touch sensor layer 50 as shown in the figure.

The substrate 1 is, for example, a polyimide film having a thickness of 15 m. The circuit 2 including the TFT has a thickness of, for example, 4 μm. The OLED 3 has a thickness of, for example, 1 μm. The TFE structure 10 has a thickness of, for example, 1.5 μm or less. The organic flattening layer 42 has a thickness of, for example, 3 m or greater and 15 μm or less. The inorganic insulating layer 44 is, for example, an $SiN_x$ layer. The $SiN_x$ layer has a thickness of, for example, 200 nm or greater and 1000 nm or less.

FIG. 1B is a partial cross-sectional view of the TFE structure 10 formed on the OLED 3. A first inorganic barrier layer (e.g., $SiN_x$ layer) 12 is formed immediately on the OLED 3, an organic barrier layer (e.g., acrylic resin layer) 14 is formed on the first inorganic barrier layer 12, and a second inorganic barrier layer (e.g., $SiN_x$ layer) 16 is formed on the organic barrier layer 14.

The organic barrier layer 14 includes a plurality of solid portions that are in contact with a top surface of the first inorganic barrier layer 12 and distributed discretely. A "solid portion" refers to a portion, of the organic barrier layer 14, where an organic film (e.g., photocured resin film) is actually present. By contrast, a portion, of the organic barrier layer 14, where the organic film is absent is referred to as a "non-solid portion". The non-solid portion enclosed by the solid portion may also be referred to as an "opening". The second inorganic barrier layer 16 is in contact with the top surface of the first inorganic barrier layer and top surfaces of the plurality of solid portions of the organic barrier layer 14. Namely, the second inorganic barrier layer 16 is in direct contact with the first inorganic barrier layer 12 in the non-solid portion of the organic barrier layer 14.

The TFE structure 10 is formed to protect the active region (see an active region R1 in FIG. 2) of the OLED display device 100. The non-solid portion of the organic barrier layer 14 includes at least a continuous portion provided to enclose the active region R1, and the active region R1 is completely enclosed by the portion in which the first inorganic barrier layer 12 and the second inorganic barrier layer 16 are in direct contact with each other (hereinafter, such a portion will be referred to as an "inorganic barrier layer joint portion"). Therefore, the solid portions of the organic barrier layer 14 do not act as a route for moisture.

A stack structure including the first inorganic barrier layer 12 and the second inorganic barrier layer 16, in contact with the top surface of the first inorganic barrier layer 12 and the top surfaces of the plurality of solid portions of the organic barrier layer 14, included in the TFE structure 10 will be referred to as a "composite stack body (10S)". The TFE structure 10 includes one composite stack body 10S. The TFE structure 10 is not limited to including one composite stack body 10S and may include two or more composite stack bodies 10S, or may further include an organic insulating layer and/or an inorganic insulating layer. In the case where the TFE structure 10 includes the composite stack body 10S as an uppermost layer, highly reliable encapsulation is realized.

For example, the first inorganic barrier layer 12 and the second inorganic barrier layer 16 are each, for example, an $SiN_x$ layer having a thickness of 400 nm, and the organic barrier layer 14 is, for example, an acrylic resin layer having a thickness less than 100 nm.

The thicknesses of the first inorganic barrier layer 12 and the second inorganic barrier layer 16 are each independently 200 nm or greater and 1500 nm or less, and preferably 1000 nm. The thickness of the organic barrier layer 14 is, for example, 10 nm or greater and less than 500 nm, and preferably 50 nm or greater and less than 300 nm. In the case where the thickness of the organic barrier layer 14 is less than 50 nm, the effect of the organic barrier layer 14 may not be fully provided. By contrast, in the case where the thickness of the organic barrier layer 14 is 500 nm or greater, the effect of the organic barrier layer 14 is saturated while the production cost is increased. It is preferred that the composite stack body 10S has a thickness of 500 nm or greater and 2000 nm or less.

The "thickness" of the organic barrier layer 14 refers to a thickness of a flat portion thereof. A liquid film of a photocurable resin used to form the organic barrier layer 14 forms a flat (horizontal) surface. Therefore, in the case where the underlying layer includes a recessed portion, the thickness of the liquid film is increased in such a region. The liquid film forms a curved surface by a surface tension (encompassing a capillary phenomenon). Therefore, the thickness of the liquid film in the vicinity of a protruding portion of the curved surface is increased. Such a locally thick portion may have a thickness exceeding 500 nm.

The thickness of the composite stack body 10S is preferably 400 nm or greater and less than 2 m, and more preferably 400 nm or greater and less than 1.5 m.

The TFE structure 10 may include an inorganic insulating layer and/or an organic insulating layer below the composite stack body 10S, above the composite stack body 10S, or between two composite stack bodies 10S. In this case, it is preferred that the inorganic insulating layer has a thickness of, for example, 400 nm or greater and 1500 mm or less. In the case where the thickness of the inorganic insulating layer is less than 400 nm, there are merely relatively small particles having a diameter of, for example, about 0.5 μm and the level of barrier property may be undesirably decreased. In the case where the thickness of the inorganic insulating layer exceeds 1500 nm, the barrier property is saturated, while the stress of the film is increased and as a result, the substrate may be warped.

It is preferred that the organic insulating layer has a thickness of 5 m or greater and 20 μm or less in the case of being formed by, for example, a common inkjet method. With the inkjet method, it is difficult to form a uniform organic insulating layer having a thickness less than 5 m. By contrast, in the case where the thickness of the organic insulating layer exceeds 20 μm, the costly material is consumed in a large amount and thus the production cost is increased. Or, in the case where the organic insulating layer is so thick, a component (dam) that keeps the organic material, provided by the inkjet method, at a predetermined position needs to be made high. This complicates the production process.

Now, with reference to FIG. 2 through FIG. 4, the structure of the OLED display device according to an embodiment of the present invention will be described in more detail. In the following, an example in which the TFE structure 10 includes one composite stack body 10S will be described.

Figure 2:
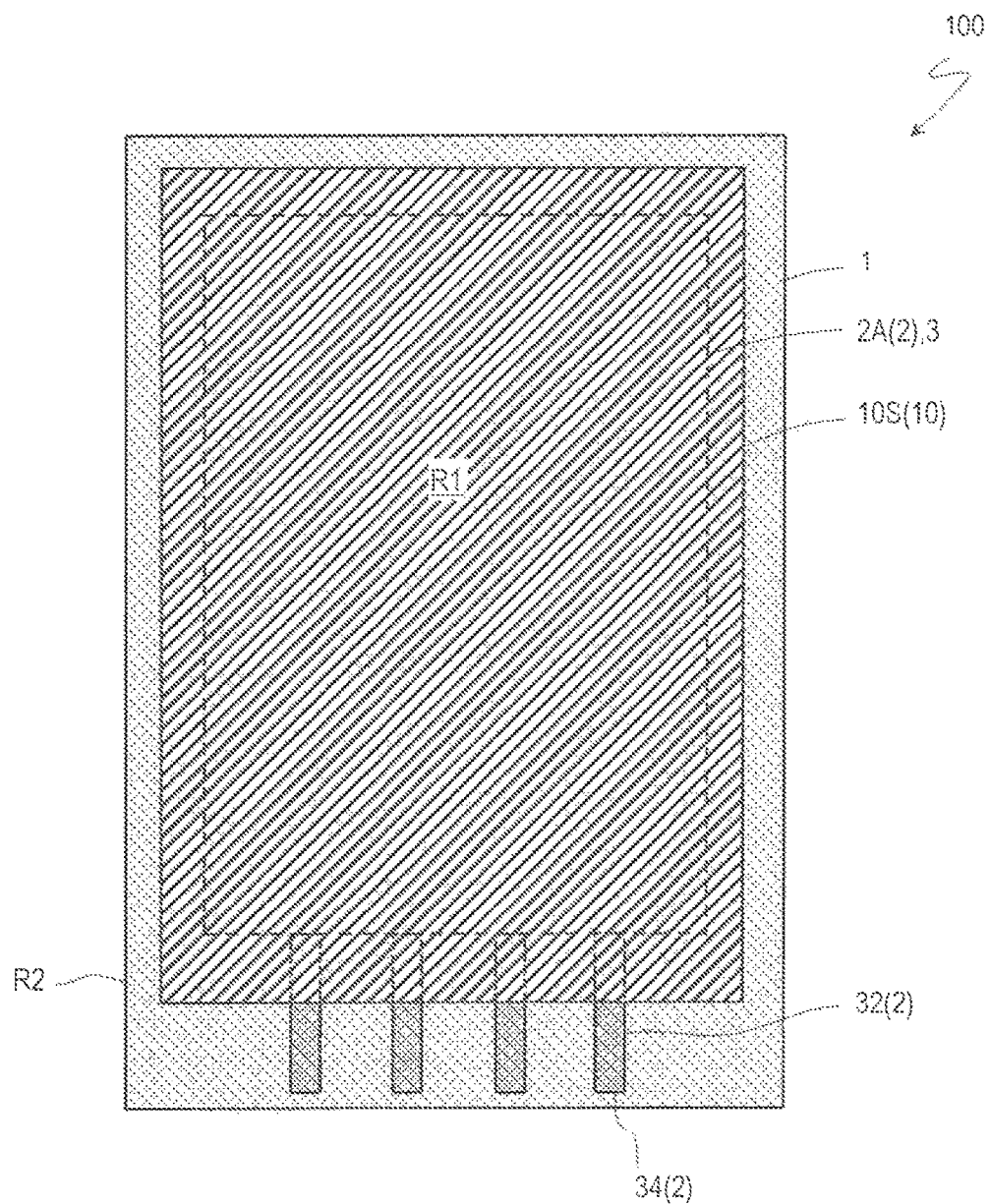
FIG. 2 is a plan view schematically showing a structure of the OLED display device 100 (TFE structure 10 and components below the TFE structure 10) according to an embodiment of the present invention.

First, FIG. 2 will be referred to. FIG. 2 is a plan view schematically showing the structure of the OLED display device 100 (the TFE structure 10 and components below the TFE structure 10) according to an embodiment of the present invention.

The circuit 2 formed on the substrate 1 includes a plurality of TFTs (not shown), and a plurality of gate bus lines (not shown) and a plurality of source bus lines (not shown) each connected to either one of the plurality of TFTs (not shown). The circuit 2 may be a known circuit that drives a plurality of the OLEDs 3. The plurality of OLEDs 3 are each connected with either one of the plurality of TFTs included in the circuit 2. The OLEDs 3 may be known OLEDs.

The circuit 2 further includes a plurality of terminals 34 located in a peripheral region R2 outer to the active region (region enclosed by the dashed line in FIG. 2) R1, where the plurality of OLEDs 3 are located, and also includes a plurality of lead wires 32 each connecting either one of the plurality of terminals 34 and either one of the plurality of gate bus lines or either one of the plurality of source bus lines to each other. The entirety of the circuit 2 including the plurality of TFTs, the plurality of gate bus lines, the plurality of source bus lines, the plurality of lead wires 32 and the plurality of terminals 34 may be referred to as a "driving circuit layer 2". A portion, of the driving circuit layer 2, that is formed in the active region R1 will be referred to as a "driving circuit layer 2A".

In FIG. 2 and the like, only the lead wires 32 and/or the terminals 34 may be shown as components of the driving circuit layer 2. Nonetheless, the driving circuit layer 2 includes a conductive layer including the lead wires 32 and the terminals 34 and further includes at least one conductive layer, at least one insulating layer, and at least one semiconductor layer. The structure of the conductive layers, the insulating layer and the semiconductor layer included in the driving circuit layer 2 may be changed in accordance with the structure of the TFT shown in, for example, FIG. 7A and FIG. 7B as an example. An insulating film (base coat) may be formed on the substrate 1 as an underlying layer for the driving circuit layer 2.

The TFE structure 10 (composite stack body 10S) is formed to protect the active region R1. The first inorganic barrier layer 12 and the second inorganic barrier layer 16 are each, for example, an $SiN_x$ layer, and are selectively formed only in a predetermined region, by plasma CVD by use of a mask, so as to cover the active region R1. In this example, the first inorganic barrier layer 12 and the second inorganic barrier layer 16 are independently and selectively formed on the active region R1 and portions, of the plurality of lead wires 32, that are closer to the active region R1. From the point of view of reliability, it is preferred that the second inorganic barrier layer 16 is formed in the same region as that of the first inorganic barrier layer 12 (formed such that the second inorganic barrier layer 16 and the first inorganic barrier layer 12 have matching outer edges) or is formed so as to cover the entirety of the first inorganic barrier layer 12. The active region R1 is enclosed by the inorganic barrier layer joint portion, where the first inorganic barrier layer 12 and the second inorganic barrier layer 16 are in direct contact with each other.

The organic barrier layer 14 may be formed by, for example, the method described in Patent Document No. 2 or 3 mentioned above. For example, in a chamber, a vapor-like or mist-like organic material (e.g., acrylic monomer) is supplied onto an element substrate maintained at a temperature lower than, or equal to, room temperature and is condensed on the element substrate. The organic material put into a liquid state is located locally, more specifically, at a border between a side surface of a protruding portion of, and a flat portion of, the first inorganic barrier layer 12 by a capillary action or a surface tension of the organic material. Then, the organic material is irradiated with, for example, ultraviolet rays to form a solid portion of the organic barrier layer (e.g., acrylic resin layer) 14 at the above-mentioned border in the vicinity of the protruding portion. The organic barrier layer 14 formed by this method does not substantially include the solid portion on the flat portion. Regarding the method for forming the organic barrier layer, the disclosures of Patent Documents Nos. 2 and 3 are incorporated herein by reference.

Alternatively, as described below, the organic barrier layer 14 may be formed by adjusting an initial thickness of the resin layer to be formed by use of a film formation device 200 (e.g., to less than 100 nm) and/or by performing ashing on the resin layer once formed. The ashing may be performed by plasma ashing using, for example, at least one type of gas among $N_2O$, $O_2$ and $O_3$.

Figure 3A:
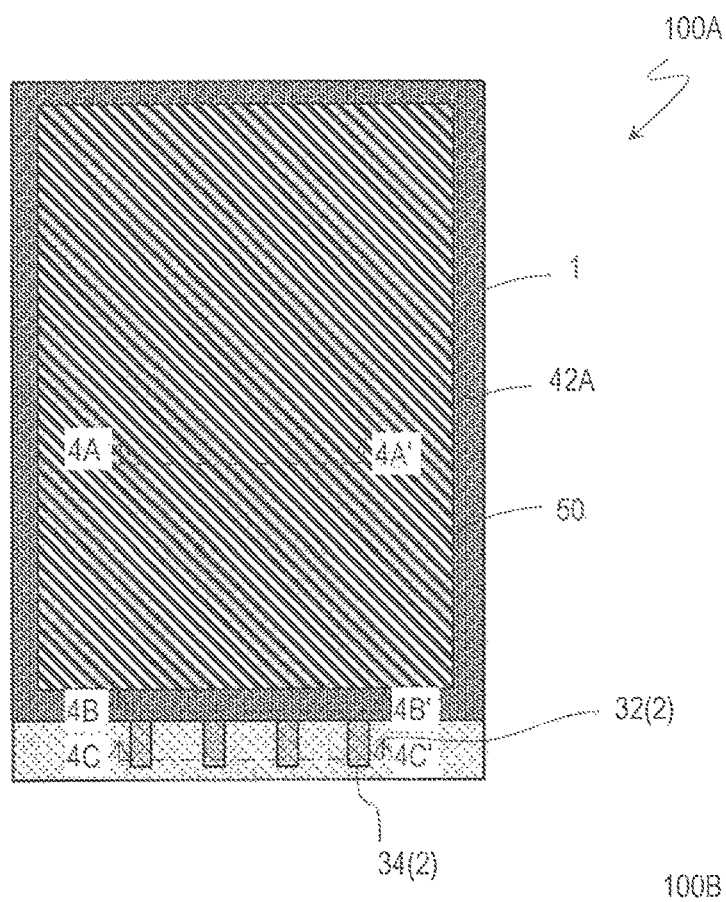
FIG. 3A and FIG. 3B are respectively plan views schematically showing structures of OLED display devices 100A and 100B (TFE structure 10 and components above the TFE structure 10) according to an embodiment of the present invention.
Figure 3B:
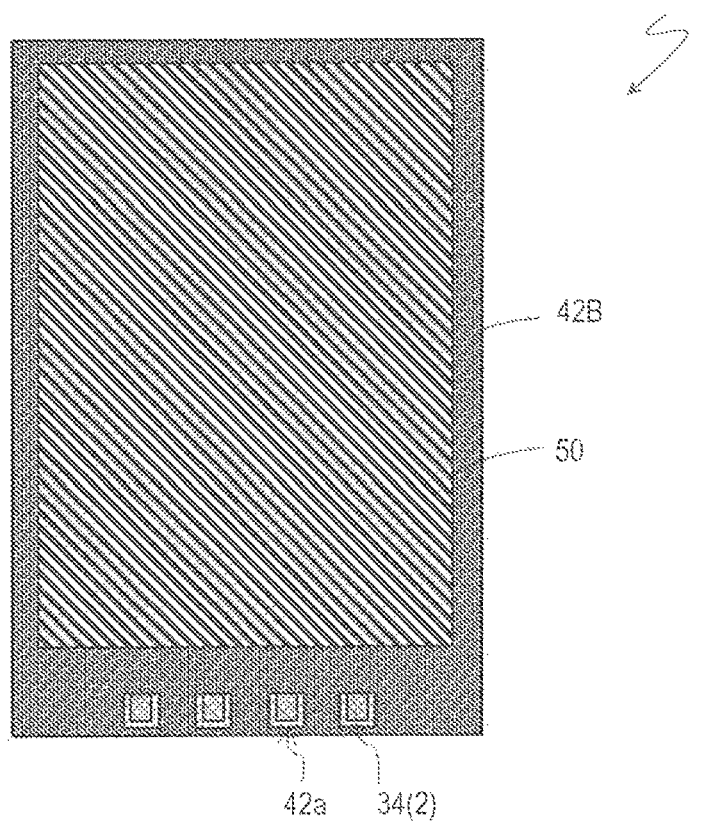

Now, FIG. 3A and FIG. 3B will be referred to. FIG. 3A is a plan view schematically showing a structure of an OLED display device 100A (the TFE structure and components above the TFE structure) according to an embodiment of the present invention. FIG. 3B is a plan view schematically showing a structure of an OLED display device 100B (the TFE structure and components above the TFE structure) according to an embodiment of the present invention.

The OLED display device 100A shown in FIG. 3A includes an organic flattening layer 42A formed of a photosensitive resin and provided on the TFE structure 10 and also includes the touch sensor layer 50 located on the organic flattening layer 42A. The OLED display device 100A may further include an inorganic insulating layer (inorganic insulating layer 44 in FIGS. 1A and 1B) provided between the organic flattening layer 42A and the touch sensor layer 50. The organic flattening layer 42A is formed only in a predetermined region on the element substrate, and is formed to expose the terminals 34 and portions, of the lead wires 32, that are in the vicinity of the terminals 34. It is sufficient that the organic flattening layer 42A is formed to cover at least the entirety of the TFE structure 10. It is preferred that the organic flattening layer 42A covers at least the entirety of the active region R1 and is formed in a range larger than that of the touch sensor layer 50.

The organic flattening layer 42A may be formed, for example, as follows.

A liquid containing a negative-type photosensitive resin is applied only to a predetermined region on the element substrate, on which the TFE structure 10 is formed. Then, the photosensitive resin on the element substrate is entirely irradiated with light. When necessary, the photosensitive resin on the element substrate is heated (prebaked) before being irradiated with the light to remove a solvent. After being irradiated with the light, the photosensitive resin on the element substrate may be, for example, heated to be further cured. The step of providing the liquid containing the photosensitive resin may be performed by, for example, a known printing method (e.g., an inkjet method and a screen printing method). Such a method does not require a photomask and does not require the post-exposure photosensitive resin to be developed.

Alternatively, a liquid containing a negative-type photosensitive resin is applied to the entirety of the element substrate, on which the TFE structure 10 is formed, and then a portion, of the photosensitive resin, that is present in a predetermined region on the element substrate is selectively irradiated with light. Still alternatively, a liquid containing a positive-type photosensitive resin is applied to the entirety of the element substrate, on which the TFE structure 10 is formed, and then a portion, of the photosensitive resin, that is present in a region other than the predetermined region on the element substrate is selectively irradiated with light. Then, the photosensitive resin is put into contact with a developer to be developed. Thus, the organic flattening layer 42A is formed in only the predetermined region.

The OLED display device 100B shown in FIG. 3B includes an organic flattening layer 42B formed of a photosensitive resin and provided on the TFE structure 10 and also includes the touch sensor layer 50 located on the organic flattening layer 42B. Unlike in the OLED display device 100A, in the OLED display device 100B, the organic flattening layer 42B covers the entirety of the element substrate. The OLED display device 100B may further include an inorganic insulating layer (inorganic insulating layer 44 in FIGS. 1A and 1B) provided between the organic flattening layer 42B and the touch sensor layer 50.

The organic flattening layer 42B may be formed, for example, as follows.

A liquid containing a negative-type or positive-type photosensitive resin is applied to the entirety of the element substrate, on which the TFE structure 10 is formed, and is exposed to light by use of a photomask and developed. Thus, the organic flattening layer 42B, which has openings 42a exposing the terminals 34, is formed. The terminals 34 may be connected with an external substrate in advance. In this case, there is no need to form the openings 42a, and thus the photomask does not need to be used.

It is preferred that the organic flattening layers 42A and 42B each have a thickness not exceeding 15 m. In the case where the thickness of each of the organic flattening layers 42A and 42B exceeds 15 μm, the bendability thereof may be declined. From the point of view of the flattening function in the case where there is a particle, it is preferred that the thickness of each of the organic flattening layers 42A and 42B is, for example, 3 m or greater.

It is preferred that the photosensitive resin contains, for example, a silicone resin (herein, this term is used in a wide sense and encompasses silicone rubber and silicone elastomer). An organic flattening layer formed of a silicone resin has a transmittance of 80% or higher to light having a wavelength of 350 nm. An acrylic resin may be used instead of the silicone resin. An organic flattening layer formed of an acrylic resin has a high transmittance to visible light. However, in order to realize a transmittance of 80% or higher to light having a wavelength of 350 nm, it is preferred to use a silicone resin. The silicone resin may be, for example, KER-2500 produced by Shin-Etsu Chemical Co., Ltd.

From the point of view of the flexibility (bendability) of the OLED display device, it is preferred that the photosensitive resin has an elastic modulus not exceeding 400 MPa at 0° C. For example, in an evaluation performed by use of a U-shape folding tester produced by Yuasa System Co., Ltd., an organic flattening layer formed of such a photosensitive resin may withstand being folded 10,000 times. Specifically, an organic flattening layer formed of such a photosensitive resin is folded at 25° C. into a U-shape such that the folded portion has a radius of 5 mm, and is subjected to a folding operation 10,000 times at an operating frequency of 1 Hz. Even after this, no crack is recognized visually or by an observation with an optical microscope. In a WVTR evaluation performed by use of Ca (calcium), a value in the order of 10-5 g/m²·day is obtained. An organic flattening layer formed of such a photosensitive resin also has an effect of alleviating application of an external force, applied to the OLED display device, onto the OLED layer.

As described above, the TFE structure 10 has a high level of barrier property. Therefore, a photosensitive resin may be applied and subjected to an exposure step and a development step on an element substrate on which the TFE structure 10 is formed. The OLED layer is easily deteriorated upon contacting a chemical agent. Therefore, in the case where the level of barrier property of the TFE structure 10 is low, the OLED layer is deteriorated in the development step.

Figure 4A:
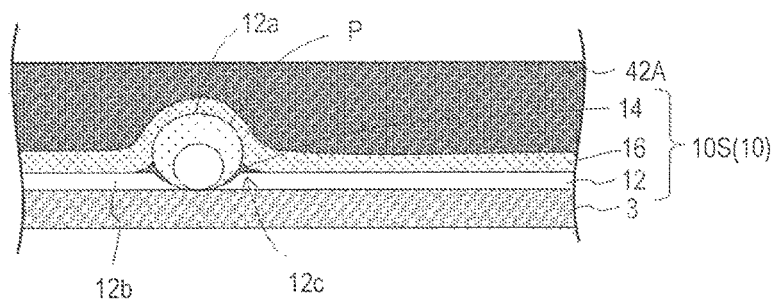
FIG. 4A through FIG. 4C are each a schematic cross-sectional view of the OLED display device 100A shown in FIG. 3A.
Figure 4B:
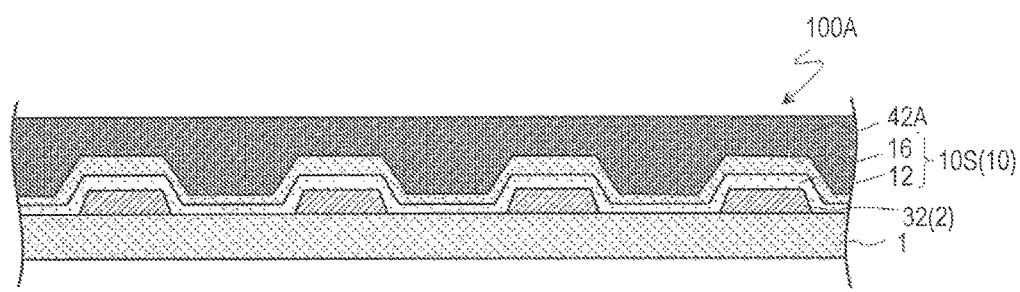
Figure 4C:
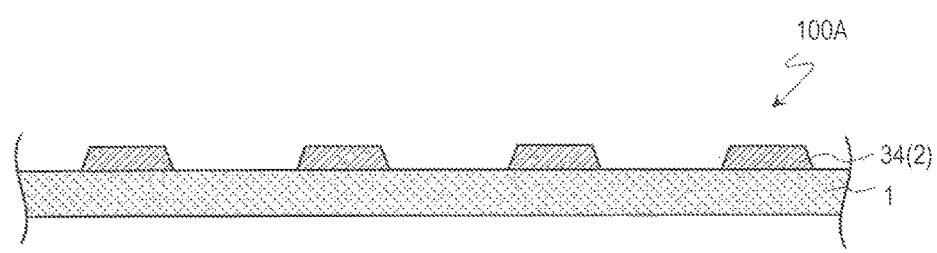
Figure 4D:
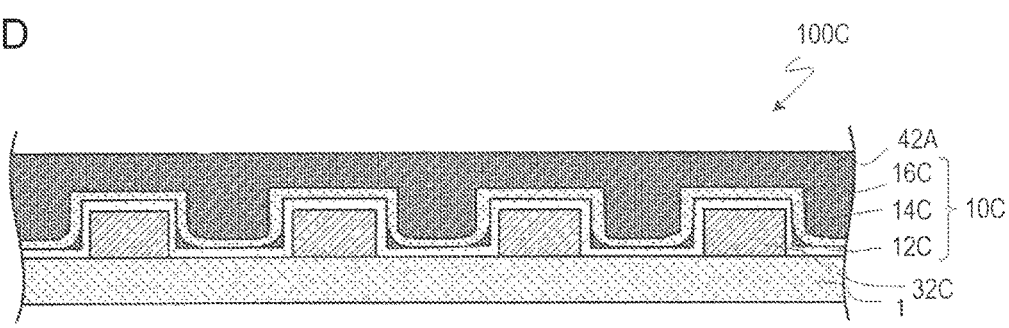
FIG. 4D is a cross-sectional view of an OLED display device 1000 in a comparative example, and corresponds to the cross-sectional view taken along line 4B-4B' in FIG. 3A.

Now, FIG. 4A through FIG. 4D will be referred to. FIG. 4A through FIG. 4C are schematic cross-sectional views of the OLED display device 100A shown in FIG. 3A. FIG. 4A is a cross-sectional view taken along line 4A-4A' in FIG. 3A, FIG. 4B is a cross-sectional view taken along line 4B-4B' in FIG. 3A, and FIG. 4C is a cross-sectional view taken along line 4C-4C' in FIG. 3A. FIG. 4D is a cross-sectional view of an OLED display device 100C in a comparative example, and corresponds to the cross-sectional view taken along line 4B-4B' in FIG. 3A.

FIG. 4A is a cross-sectional view taken along line 4A-4A' in FIG. 3A, and shows a portion including a particle P. The particle P is a microscopic dust particle generated during the production of the OLED display device, and is, for example, a microscopic piece of broken glass, a metal particle or an organic particle. Such a particle is generated especially easily in the case where mask vapor deposition is used.

As shown in FIG. 4A, the organic barrier layer (solid portion) 14 may be formed only in the vicinity of the particle P. A reason for this is that the acrylic monomer supplied after the first inorganic barrier layer 12 is formed is condensed and present locally, more specifically, in the vicinity of a surface of a first inorganic barrier layer 12a on the particle P (the surface has a tapering angle θ of 90 degrees or larger). The opening (non-solid portion) of the organic barrier layer 14 is on the flat portion of the first inorganic barrier layer 12.

In the case where the particle (having a diameter of, for example, 1 m or longer) P is present, a crack (defect) 12c may be formed in the first inorganic barrier layer 12. This is considered to be caused by impingement of the $SiN_x$ layer 12a growing from a surface of the particle P and an SiN layer 12b growing from a flat portion of a surface of the OLED 3. In the case where such a crack 12c is present, the level of barrier property of the TFE structure 10 is decreased.

In the TFE structure 10 in the OLED display device 100, as shown in FIG. 4A, the organic barrier layer 14 is formed to fill the crack 12c of the first inorganic barrier layer 12, and a surface of the organic barrier layer 14 (recessed surface) couples the surface of the first inorganic barrier layer 12a on the particle P and a surface of the first inorganic barrier layer 12b on the flat portion of the OLED 3 to each other continuously and smoothly. The organic barrier layer 14 is formed by curing a photocurable resin in a liquid state as described below, and therefore, has a recessed surface formed by a surface tension. In this state, the photocurable resin exhibits a high level of wettability to the first inorganic barrier layer 12. If the level of wettability of the photocurable resin to the first inorganic barrier layer 12 is low, the surface of the organic barrier layer 14 may protrude, instead of being recessed.

The organic barrier layer (solid portion) 14 has such a recessed surface. Therefore, the second inorganic barrier layer 16, which is formed on the first inorganic barrier layer 12a on the particle P and also on the organic barrier layer 14, is a fine film with no defect. As can be seen, even if the particle P is present, the organic barrier layer 14 keeps high the level of barrier property of the TFE structure 10 (composite stack body 10S).

The organic barrier layer (solid portion) 14, which is relatively soft, is present in the vicinity of the particle P, and the second inorganic barrier layer 16 is present continuously on the particle P. Therefore, even if the composite stack body 10S is bent, generation of cracks in the composite stack body 10S from the particle P is suppressed. Thus, the decrease in the level of barrier property by the bending is suppressed, and as a result, the composite stack body 10S has a high resistance against bending.

As shown in FIG. 4B, in a region close to the active region R1 (cross-section taken along line 4B-4B' in FIG. 3A), the TFE structure 10 and the organic flattening layer 42A are formed on the lead wires 32.

As shown in FIG. 4C, the terminals 34 are exposed and are used to be electrically connected with an external circuit (e.g., FPC (Flexible Printed Circuits)).

In a region including the portion shown in FIG. 4B, the organic barrier layer (solid portion) may be formed during the formation of the organic barrier layer 14 of the TFE structure 10. For example, the OLED display device 100C in the comparative example shown in FIG. 4D includes a TFE structure 10C. In the TFE structure 10C, in a cross-section of each of the lead wires 32 that is taken along a plane parallel to a line width direction thereof, a side surface of the lead wire 32 has a tapering angle θ of 90 degrees or larger. In such a case, an organic barrier layer 14C may be formed on the side surface of the lead wire 32. By contrast, in the OLED display device 100A according to an embodiment, the tapering angle θ of the side surface of the cross-section of each of the lead wires 32 and the terminals 34 is smaller than 90 degrees, and thus the photocurable resin is not located locally. Therefore, the organic barrier layer (solid portion) is not formed on the side surface of any of the lead wires 32 or any of the terminals 34.

Assuming that the method for forming the organic barrier layer described in Patent Document No. 2 or 3 is used in the case where the tapering angle of the side surface is 90 degrees or larger, a vapor-like or mist-like organic material (e.g., acrylic monomer) is condensed, and thus the organic barrier layer (solid portion) is formed, along a border between the side surface and the flat surface (making an angle of 90 degrees or smaller). When this occurs, for example, the organic barrier layer (solid portion) formed along the lead wire acts as a route that guides water vapor in the air to the active region.

In the OLED display device 100A in an embodiment according to the present invention shown in FIG. 4B, the tapering angles of the side surfaces of the lead wires 32 and the first inorganic barrier layer 12 are all smaller than 90 degrees. Thus, the organic barrier layer 14 is not formed along these side surfaces. Therefore, moisture in the air does not reach the inside of the active region R1 via the organic barrier layer (solid portion) 14, and thus the OLED display device 100A may have a high level of moisture-resistant reliability. In this example, the tapering angle of the lead wire 32 is smaller than 90 degrees. It is sufficient that the side surface, of the first inorganic barrier layer 12, that forms a surface immediately below the inorganic barrier layer 14 has a tapering angle smaller than 90 degrees.

In the case where the tapering angle of the side surface is in the range of 70 degrees or larger and smaller than 90 degrees, the organic barrier layer (solid portion) 14 may be formed along the side surface. Needless to say, the resin present locally, namely, along the inclining side surface, is removed by ashing. However, the ashing is time-consuming. For example, the ashing needs to be performed for a long time even after the resin formed on the flat surface is removed. In addition, there may be a problem that as a result of the organic barrier layer (solid portion) formed in the vicinity of the particle P being excessively ashed (removed), the effect of the formation of the organic barrier layer is not fully provided. In order to suppress or prevent this problem, the tapering angle θ of the first inorganic barrier layer 12 is preferably smaller than 70 degrees, and more preferably 60 degrees or smaller.

The touch sensor layer 50 included in the OLED display device 100 according to an embodiment of the present invention may be a known touch sensor layer, for example, a touch sensor of a resistive film system or of a projected capacitive system. With reference to FIGS. 5A-5B and FIGS. 6A-6B, structures of a touch sensor layer 50A and a touch sensor layer 50B preferably usable for the OLED display device 100 will be described.

Figure 5A:
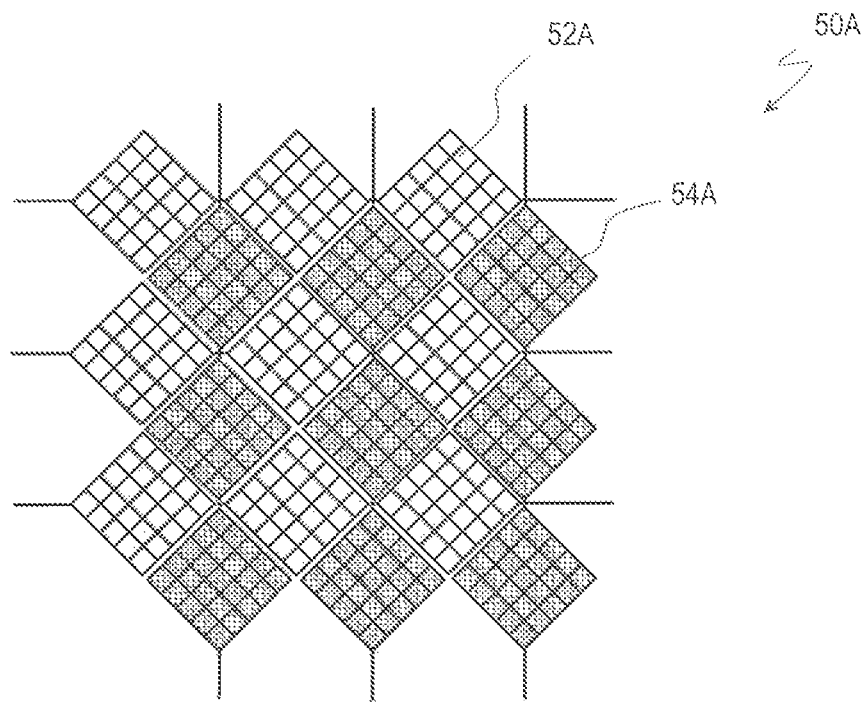
FIG. 5A and FIG. 5B each schematically show a structure of a touch sensor layer 50A, which may be included in an OLED display device according to an embodiment of the present invention.
Figure 5B:
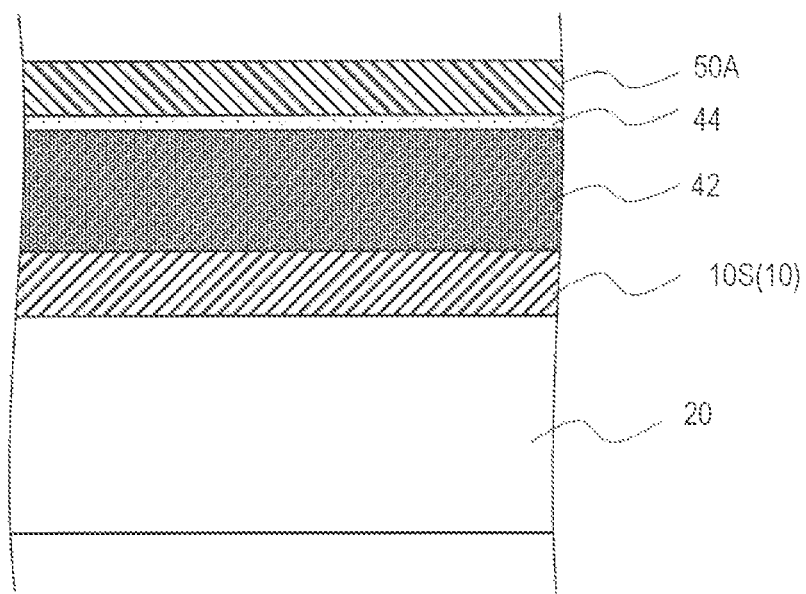

FIG. 5A is a schematic plan view of the touch sensor layer 50A, and FIG. 5B is a cross-sectional view of the touch sensor layer 50A. The touch sensor layer 50A is formed on the inorganic insulating layer 44 formed on the organic flattening layer 42.

The touch sensor layer 50A includes a plurality of X electrodes 52A extending in an X direction and a plurality of Y electrodes 54A extending in a Y direction perpendicular to the X direction. The X electrodes 52A and the Y electrodes 54A are both formed of a metal mesh. A minimum unit of the metal mesh is, for example, a square having a size of 35 µm×35 µm. A plurality of such squares are assembled to form a square unit electrode having a size of, for example, 3 mm×3 mm. Such unit electrodes are connected in the X direction or the Y direction by wires. At a portion where the wires cross each other, the wires are insulated from each other by, for example, an inorganic insulating layer ($SiN_x$ layer) (not shown). The metal mesh has, for example, a stack structure of a Ti layer and an Al layer, or a stack structure of Ti layer/Al layer/Ti layer.

Figure 6A:
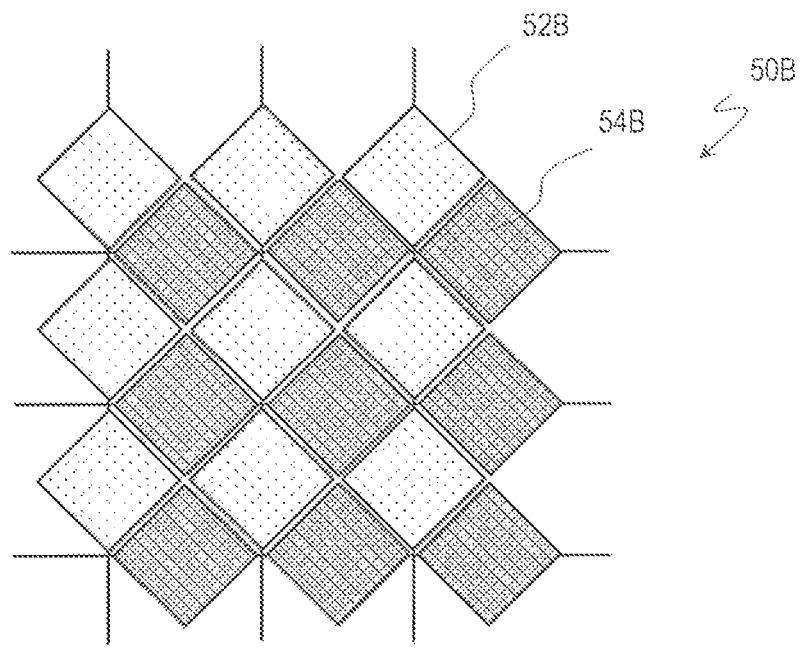
FIG. 6A and FIG. 6B each schematically show a structure of another touch sensor layer 50B, which may be included in an OLED display device according to an embodiment of the present invention.
Figure 6B:
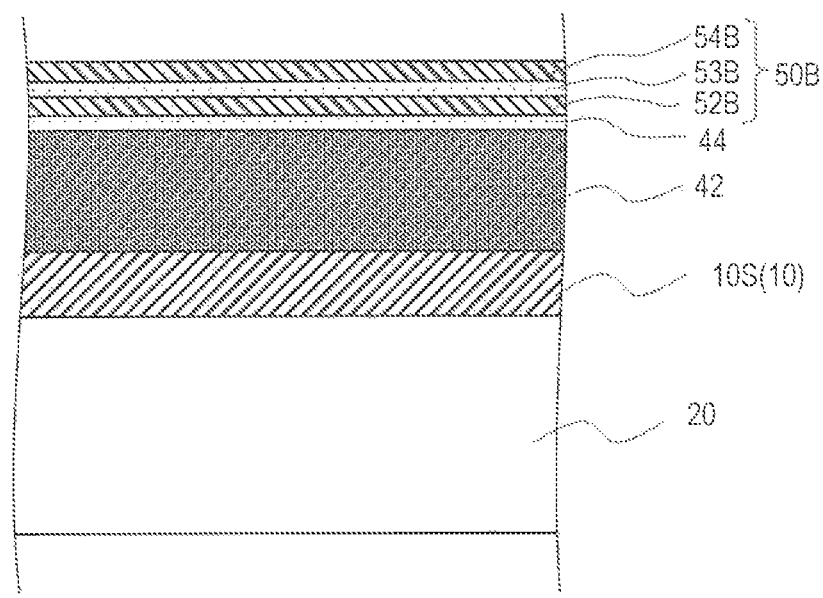

FIG. 6A is a schematic plan view of the touch sensor layer 50B, and FIG. 6B is a cross-sectional view of the touch sensor layer 50B. The touch sensor layer 50B is formed on the inorganic insulating layer 44 formed on the organic flattening layer 42. X electrodes 52B and Y electrodes 54B included in the touch sensor layer 50B are each formed of a transparent conductive layer (e.g., ITO layer), and are insulated from each other by an inorganic insulating layer (e.g., $SiN_x$ layer). From the point of view of light transmittance, the touch sensor layer 50A is more advantageous.

In order to produce the flexible OLED display device 100, a polyimide film, for example, is formed on a support substrate (e.g., glass substrate), and the polyimide film on the support substrate is used as the substrate 1. An OLED display device including the touch sensor layer 50A or 50B described herein as an example may be obtained by peeling off the polyimide film from the support substrate after the touch sensor layer 50A or 50B is formed.

Now, with reference to FIGS. 7A-7B and FIGS. BA-8B, an example of TFT usable for the OLED display device 100, and an example of lead wires and terminals formed by use of a gate metal layer and a source metal layer used to form the TFT, will be described.

For a medium- or small-sized high-definition OLED display device, a low temperature polycrystalline silicon (hereinafter, referred to simply as "LTPS") TFT or an oxide TFT (e.g., four-component-based (In—Ga—Zn—O-based) oxide TFT containing In (indium), Ga (gallium), Zn (zinc) and O (oxygen)) having a high mobility is preferably used. Structures of, and methods for producing, the LTPS-TFT and the In—Ga—Zn—O-based TFT are well known and will be described below merely briefly.

Figure 7A:
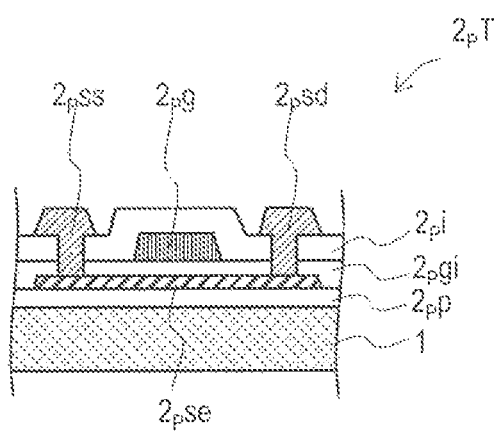
FIG. 7A and FIG. 7B are each a schematic cross-sectional view showing an example of TFT that may be included in an OLED display device according to an embodiment.

FIG. 7A is a schematic cross-sectional view of an LTPS-TFT $2_PT$. The TFT $2_PT$ may be included in the circuit 2 of the OLED display device 100. The LTPS-TFT $2_PT$ is a top gate-type TFT.

The TFT $2_PT$ is formed on a base coat $2_pp$ on the substrate (e.g., polyimide film) 1. Although not described above, it is preferred that a base coat formed of an inorganic insulating material is formed on the substrate 1.

The TFT $2_PT$ includes a polycrystalline silicon layer $2_Pse$ formed on the base coat $2_pp$, a gate insulating layer $2_Pgi$ formed on the polycrystalline silicon layer $2_Pse$, a gate electrode $2_pg$ formed on the gate insulating layer $2_Pgi$, an interlayer insulating layer $2_pi$ formed on the gate electrode $2_pq$, and a source electrode $2_pss$ and a drain electrode $2_psd$ formed on the interlayer insulating layer $2_pi$. The source electrode $2_pss$ and the drain electrode $2_psd$ are respectively connected with a source region and a drain region of the polycrystalline silicon layer $2_Pse$ in contact holes formed in the interlayer insulating layer $2_pi$ and the gate insulating layer $2_pgi$.

The gate electrode $2_pq$ is included in a gate metal layer including the gate bus lines, and the source electrode $2_pss$ and the drain electrode $2_psd$ are included in a source metal layer including the source bus lines. The gate metal layer and the source metal layer are used to form lead wires and terminals (described below with reference to FIGS. 8A-8B).

The TFT $2_PT$ is formed, for example, as follows.

As the substrate 1, a polyimide film having a thickness of 15 µm, for example, is prepared.

The base coat $2_pp$ ($SiO_2$ film: 250 nm/$SiN_x$ film: 50 nm/$SiO_2$ film: 500 nm (top layer/middle layer/bottom layer)) and an a-Si film (40 nm) are formed by plasma CVD.

The a-Si film is subjected to dehydrogenation (e.g., annealed at 450° C. for 180 minutes).

The a-Si film is polycrystalline-siliconized by excimer laser annealing (ELA).

The a-Si film is patterned by a photolithography step to form an active layer (semiconductor island).

A gate insulating film ($SiO_2$ film: 50 nm) is formed by plasma CVD.

A channel region of the active layer is doped with ($B^+$).

The gate metal layer (Mo: 250 nm) is formed by sputtering and patterned by a photolithography step (including a dry etching step) (to form the gate electrode $2_pg$, the gate bus lines, and the like).

A source region and a drain region of the active layer are doped with ($P^+$).

Activation annealing (e.g., annealing at 450° C. for 45 minutes) is performed. As a result, the polycrystalline silicon layer $2_Pse$ is formed.

An interlayer insulating film (e.g., $SiO_2$ film: 300 nm/$SiN_x$ film: 300 nm (top layer/bottom layer)) is formed by plasma CVD.

The contact holes are formed in the gate insulating film and the interlayer insulating film by dry etching. As a result, the interlayer insulating layer $2_pi$ and the gate insulating layer $2_pgi$ are formed.

The source metal layer (Ti film: 100 nm/Al film: 300 nm/Ti film: 30 nm) is formed by sputtering and patterned by a photolithography step (including a dry etching step) (to form the source electrode $2_pss$, the drain electrode $2_psd$, the source bus lines, and the like).

Figure 7B:
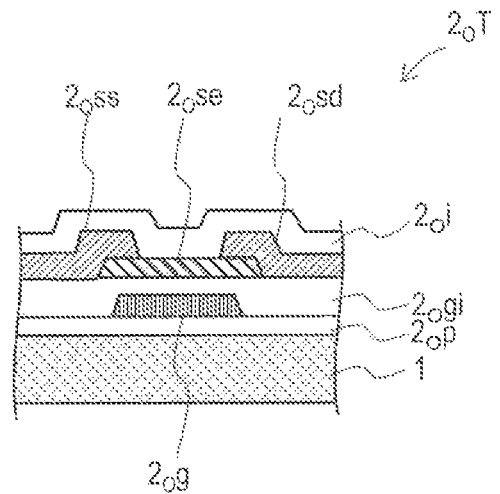

FIG. 7B is a schematic cross-sectional view of an In—Ga—Zn—O-based TFT $2_0T$. The TFT $2_0T$ may be included in the circuit 2 of the OLED display device 100A. The TFT $2_0T$ is a bottom gate-type TFT.

The TFT $2_0T$ is formed on a base coat $2_op$ on the substrate 1 (e.g., polyimide film). The TFT $2_0T$ includes a gate electrode $2_og$ formed on the base coat $2_op$, a gate insulating layer $2_ogi$ formed on the gate electrode $2_og$, an oxide semiconductor layer $2_ose$ formed on the gate insulating layer $2_ogi$, and a source electrode $2_oss$ and a drain electrode $2_oad$ respectively formed on a source region and a drain region of the oxide semiconductor layer $2_ose$. The source electrode $2_oss$ and the drain electrode $2_osd$ are covered with an interlayer insulating layer $2_oi$.

The gate electrode $2_og$ is included in a gate metal layer including the gate bus lines, and the source electrode $2_oss$ and the drain electrode $2_od$ are included in a source metal layer including the source bus lines. The gate metal layer and the source metal layer are used to form lead wires and terminals, and thus the TFT $2_oT$ may have a structure described below with reference to FIGS. 8A-8B.

The TFT $2_oT$ is formed, for example, as follows.

As the substrate 1, a polyimide film having a thickness of 15 μm, for example, is prepared.

The base coat $2_op$ ($SiO_2$ film: 250 nm/$SiN_x$ film: 50 nm/$SiO_2$ film: 500 nm (top layer/middle layer/bottom layer)) is formed by plasma CVD.

The gate metal layer (Cu film: 300 nm/Ti film: 30 nm (top layer/bottom layer)) is formed by sputtering and patterned by a photolithography step (including a dry etching step) (to form the gate electrode $2_og$, the gate bus lines, and the like).

A gate insulating film ($SiO_2$ film: 30 nm/$SiN_x$ film: 350 nm (top layer/bottom layer)) is formed by plasma CVD.

An oxide semiconductor film (In—Ga—Z—O-based semiconductor film: 100 nm) is formed by sputtering and patterned by a photolithography step (including a wet etching step) to form an active layer (semiconductor island).

The source metal layer (Ti film: 100 nm/Al film: 300 nm/Ti film: 30 nm (top layer/middle layer/bottom layer)) is formed by sputtering and patterned by a photolithography step (including a dry etching step) (to form the source electrode $2_o$ss, the drain electrode $2_o$sd, the source bus lines, and the like).

Activation annealing (e.g., annealing at 300° C. for 120 minutes) is performed. As a result, the oxide semiconductor layer $2_o$se is formed.

Then, an interlayer insulating film $2_oi$ (e.g., $SiN_x$ film: 300 nm/$SiO_2$ film: 300 nm (top layer/bottom layer)) is formed by plasma CVD as a protective film.

Figure 8A:
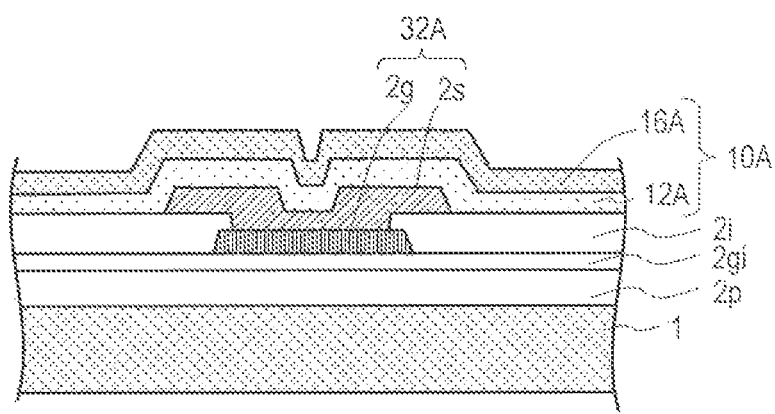
FIG. 8A and FIG. 8B are each a schematic cross-sectional view of another OLED display device according to an embodiment, and respectively correspond to FIG. 4B and FIG. 4C.
Figure 8B:
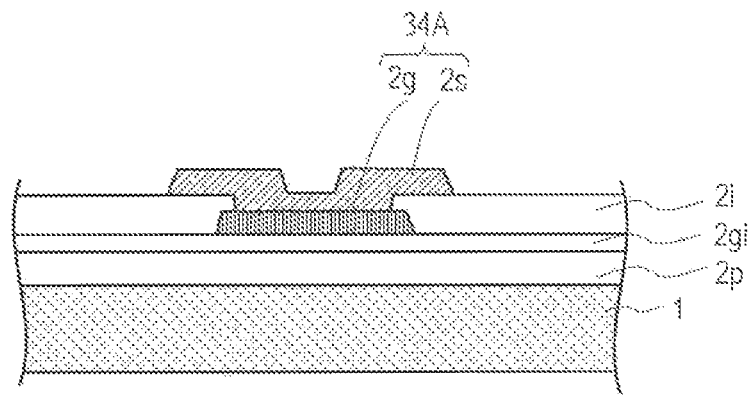

Now, with reference to FIG. 8A and FIG. 8B, a structure of another OLED display device according to an embodiment will be described. The circuit (backplane) 2 of this OLED display device includes the TFT $2_FT$ shown in FIG. 7A or the TFT $2_oT$ shown in FIG. 7B. The gate metal layer and the source metal layer used to form the TFT $2_FT$ or the TFT $2_oT$ are used to form a lead wire 32A and a terminal 34A. FIG. 8A and FIG. 8B respectively correspond to FIG. 4B and FIG. 4C. Components corresponding to those in FIG. 4B and FIG. 4C will be represented by the identical reference signs thereto provided with letter "A" at the end. The TFE structure 10A shown in FIG. 8A is covered with an organic flattening layer (not shown). A base coat $2p$ in FIG. 8A and FIG. 8B corresponds to the base coat $2_pp$ in FIG. 7A and the base coat $2_op$ in FIG. 7B. A gate insulating layer $2gi$ in FIG. 8A and FIG. 8B corresponds to the gate insulating layer $2_pgi$ in FIG. 7A and the gate insulating layer $2_ogi$ in FIG. 7B. An interlayer insulating layer $2i$ in FIG. 8A and FIG. 8B corresponds to the interlayer insulating layer $2_pi$ in FIG. 7A and the interlayer insulating layer $2_oi$ in FIG. 7B.

As shown in FIG. 8A and FIG. 8B, a gate metal layer $2g$ and a source metal layer $2a$ are formed on the base coat $2p$, which is formed on the substrate 1. Although not shown in FIGS. 4A-4D, it is preferred that the base coat $2p$ formed of an inorganic insulating material is formed on the substrate 1.

As shown in FIG. 8A and FIG. 8B, the lead wire 32A and the terminal 34A are each formed as a stack body of the gate metal layer $2g$ and the source metal layer $2s$. A portion of the lead wire 32A and a portion of the terminal 34A that are formed of the gate metal layer $2g$ have, for example, the same cross-sectional shape as that of the gate bus lines. A portion of the lead wire 32A and a portion of the terminal 34A that are formed of the source metal layer $2a$ have, for example, the same cross-sectional shape as that of the source bus lines. In the case of, for example, a 5.7-type display device of 500 ppi, the portion formed of the gate metal layer $2g$ has a line width of, for example, 10 μm, and a distance between two adjacent such lines is 16 μm (L/S=10/16). The portion formed of the source metal layer $2a$ has a line width of, for example, 16 μm, and a distance between two adjacent such lines is 10 μm (L/S=16/10). These portions each have a tapering angle θ smaller than 90 degrees, preferably smaller than 70 degrees, and more preferably 60 degrees or smaller.

Figure 9A:
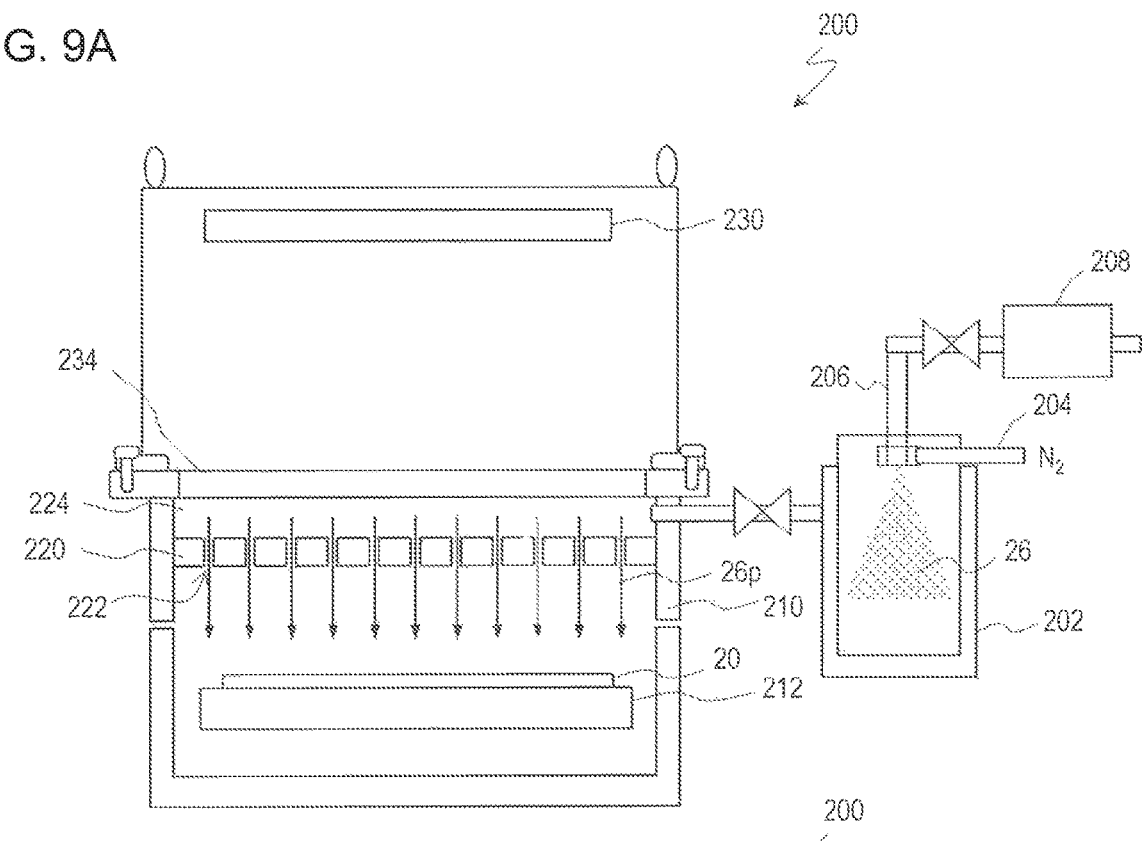
FIG. 9A and FIG. 9B each schematically show a structure of a film formation device 200.
Figure 9B:
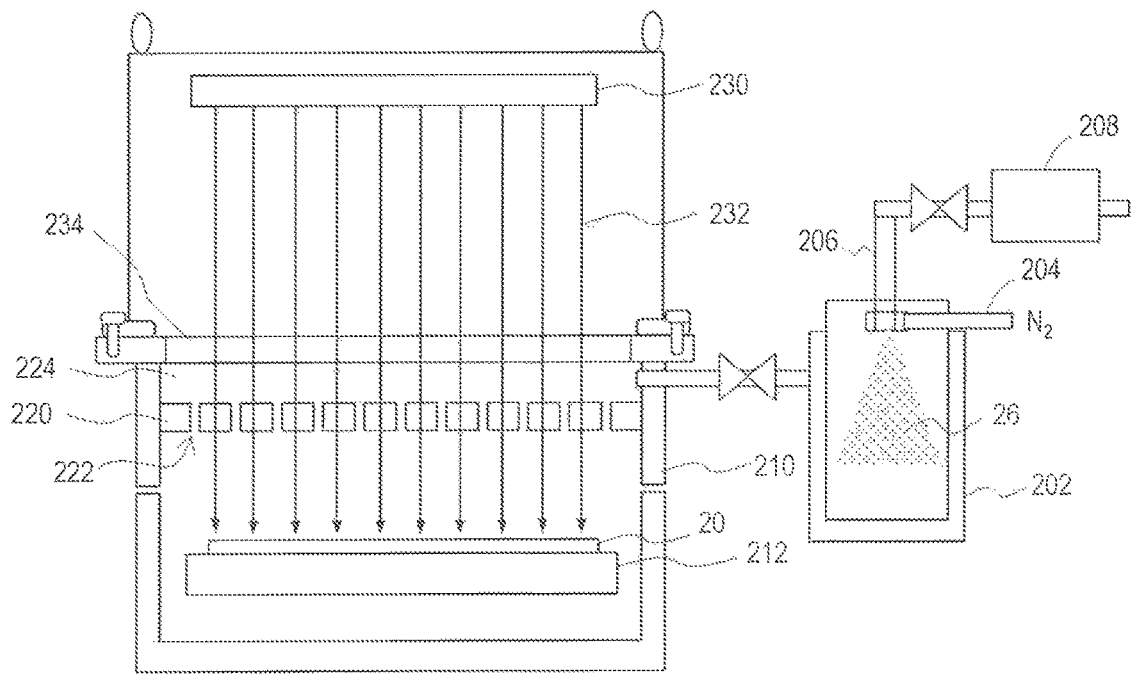

Now, with reference to FIG. 9A and FIG. 9B, a film formation device 200 usable to form an organic barrier layer, and a film formation method using the same will be described. FIG. 9A and FIG. 9B schematically show a structure of the film formation device 200. FIG. 9A shows a state of the film formation device 200 in a step of, in a chamber having a vapor-like or mist-like photocurable resin located therein, condensing the photocurable resin on the first inorganic barrier layer. FIG. 9B shows a state of the film formation device 200 in a step of irradiating the photocurable resin with light to which the photocurable resin is sensitive and thus curing the photocurable resin.

The film formation device 200 includes a chamber 210 and a partition wall 234 dividing an inner space of the chamber 210 into two spaces. In one of the spaces, in the chamber 210, demarcated by the partition wall 234, a stage 212 and a shower plate 220 are located. In the other space demarcated by the partition wall 234, an ultraviolet irradiation device 230 is located. The inner space of the chamber 210 is controlled to have a predetermined pressure (vacuum degree) and a predetermined temperature. The stage 212 has a top surface that receives an element substrate 20 including the plurality of the OLEDs 3, on which the first inorganic barrier layer is formed. The top surface may be cooled down to, for example, −20° C.

The shower plate 220 is located to have a gap 224 between the shower plate 220 and the partition wall 234. The shower plate 220 includes a plurality of through-holes 222. The gap 224 may have a size of, for example, 100 mm or longer and 1000 mm or shorter in a vertical direction. An acrylic monomer (vapor-like or mist-like) supplied to the gap 224 is supplied, via the plurality of through-holes 222 of the shower plate 220, to one of the spaces of the chamber 210 in which the stage 212 is located. When necessary, the acrylic monomer is heated. A vapor-like or mist-like acrylic monomer $26p$ is attached to, or contacts, the first inorganic barrier layer on the element substrate 20. An acrylic monomer 26 is supplied from a container 202 into the chamber 210 at a predetermined flow rate. The container 202 is supplied with the acrylic monomer 26 via a pipe 206 and is also supplied with nitrogen gas from a pipe 204. The flow rate of the acrylic monomer supplied to the container 202 is controlled by a mass flow controller 208. A material supply device includes the shower plate 220, the container 202, the pipes 204 and 206, the mass flow controller 208 and the like.

The ultraviolet irradiation device 230 includes an ultraviolet light source and an optional optical element. The ultraviolet light source may be, for example, an ultraviolet lamp (e.g., mercury lamp (encompassing a high-pressure lamp and a super-high pressure lamp), a mercury-xenon lamp or a metal halide lamp). Alternatively, the ultraviolet light source may be an ultraviolet light emitting semiconductor element such as an ultraviolet LED, an ultraviolet semiconductor laser or the like. The optical element encompasses, for example, a reflective mirror, a prism, a lens, an optical fiber, a diffractive element, a spatial modulation element, and a hologram. A plurality of ultraviolet light sources may be used in the case where the ultraviolet light sources are of a certain type or a certain size.

The ultraviolet irradiation device 230 emits light having a predetermined wavelength and a predetermined intensity toward the top surface of the stage 212 when being located at a predetermined position. It is preferred that the partition wall 234 and the shower plate 220 are formed of a material having a high transmittance to ultraviolet rays, for example, quartz.

The organic barrier layer 14 may be formed, for example, as follows by use of the film formation device 200. In this example, an acrylic monomer is used as the photocurable resin.

The acrylic monomer 26p is supplied into the chamber 210. The element substrate 20 has been cooled to, for example, −15° C. on the stage 212. The acrylic monomer 26p is condensed on the first inorganic barrier layer 12 on the element substrate 20. The conditions in this step may be controlled such that the liquid-state acrylic monomer is present locally, more specifically, only in the vicinity of the protruding portion of the first inorganic barrier layer 12. Alternatively, the conditions may be controlled such that the acrylic monomer condensed on the first inorganic barrier layer 12 forms a liquid film.

The viscosity and/or the surface tension of the photocurable resin in the liquid state may be adjusted to control the thickness of the liquid film or the shape of the portion of the liquid film that is to be in contact with the protruding portion of the first inorganic barrier layer 12 (namely, the shape of the recessed portion). For example, the viscosity and the surface tension depend on the temperature. Therefore, the temperature of the element substrate may be adjusted to control the viscosity and the surface tension. For example, the size of the solid portion that is present on the flat portion may be controlled by the shape of a portion, of the liquid film, that is to be in contact with the protruding portion of the first inorganic barrier layer 12 (namely, the shape of the recessed portion) and by the conditions of ashing to be performed in a later step.

Next, the ultraviolet irradiation device 230 is used to, typically, irradiate the entirety of a top surface of the element substrate 20 with ultraviolet rays 232 to cure the acrylic monomer on the first inorganic barrier layer 12. As an ultraviolet light source, for example, a high-pressure mercury lamp that provides light having a main peak wavelength of 365 nm is used. The ultraviolet rays are directed at an intensity of, for example, 12 mW/cm$^2$ for about 10 seconds.

The organic barrier layer 14 formed of an acrylic resin is formed in this manner. The tact time of the step of forming the organic barrier layer 14 is shorter than, for example, about 30 seconds. Thus, the mass-productivity is very high.

Alternatively, after the photocurable resin in the liquid state is cured and ashing is performed, the organic barrier layer 14 may be formed only in the vicinity of the protruding portion. Even in the case where the organic barrier layer 14 is formed by curing the photocurable resin present locally, ashing may be performed. The ashing improves the adhesiveness between the organic barrier layer 14 and the second inorganic barrier layer 16. Namely, the ashing may be used to modify (make hydrophilic) the surface of the organic barrier layer 14, as well as to remove an extra portion of the organic barrier layer once formed.

The ashing may be performed by use of a known plasma ashing device, a known photoexcitation ashing device, or a known UV ozone ashing device. For example, plasma ashing using at least one type of gas among $N_2O$, $O_2$ and $O_3$, or a combination of such plasma ashing and ultraviolet irradiation, may be performed. In the case where an SiN film is formed by CVD as each of the first inorganic barrier layer 12 and the second inorganic barrier layer 16, $N_2O$ is used as a material gas. Therefore, use of $N_2O$ for the ashing provides an advantage that the device is simplified.

In the case where the ashing is performed, the surface of the organic barrier layer 14 is oxidized and thus is modified to be hydrophilic. In addition, the surface of the organic barrier layer 14 is shaved almost uniformly, and extremely tiny convexed and concaved portions are formed, which increases the surface area size. The effect of increasing the surface area size provided by the ashing is greater for the surface of the organic barrier layer 14 than for the first inorganic barrier layer 12 formed of an inorganic material. Since the surface of the organic barrier layer 14 is modified to be hydrophilic and the surface area size of the surface is increased, the adhesiveness of the organic barrier layer 14 with the second inorganic barrier layer 16 is improved.

After the above, the resultant body is transported to a CVD chamber in order to form the second inorganic barrier layer 16. The second inorganic barrier layer 16 is formed under, for example, the same conditions as those for the first inorganic barrier layer 12. The second inorganic barrier layer 16 is formed in the region where the first inorganic barrier layer 12 is formed. Therefore, the inorganic barrier layer joint portion, where the first inorganic barrier layer 12 and the second inorganic barrier layer 16 are in direct contact with each other, is formed in the non-solid portion of the organic barrier layer 14. For this reason, as described above, water vapor in the air is suppressed or prevented from reaching the inside of the active region via the organic barrier layer.

The first inorganic barrier layer 12 and the second inorganic barrier layer 16 are formed, for example, as follows. An inorganic barrier layer having a thickness of 400 nm may be formed by plasma CVD using $SiH_4$ gas and $N_2O$ gas, at a film formation rate of 400 nm/min, in a state where, for example, the temperature of the substrate on which the inorganic barrier layer is to be formed (the temperature of the OLED 3) is controlled to be 80° C. or lower. The inorganic barrier layer thus formed has a refractive index of 1.84 and a transmittance of 90% to visible light having a wavelength of 400 nm (thickness: 400 nm). The film stress has an absolute value of 50 MPa.

The inorganic barrier layer may be an $SiO_2$ layer, an $SiO_xN_y$ (x>y) layer, an $SiN_xO_y$ (x>y) layer, an $Al_2O_3$ layer or the like as well as an $SiN_x$ layer. A photocurable resin contains, for example, a vinyl group-containing monomer. Among vinyl group-containing monomers, an acrylic monomer is preferably used. A photoinitiator may be incorporated into the acrylic monomer when necessary. As the acrylic monomer, any of various known acrylic monomers is usable. A plurality of acrylic monomers may be mixed together. For example, a two-functional monomer and a monomer including three or more functional groups may be mixed together. An oligomer may be mixed. As the photocurable resin, an ultraviolet-curable silicone resin may be used. A silicone resin (encompassing silicone rubber) is highly transmissive to visible light and highly resistant against climate, and is not easily yellowed even after being used for a long period of time. A photocurable resin that is cured by being irradiated with visible light may be used. The photocurable resin, before being cured, has a viscosity at room temperature (e.g., 25° C.) that is preferably lower than, or equal to, 10 Pa·s, and is especially preferably 1 to 100 mPa·s. In the case where the viscosity is too high, it may be difficult to form a thin film having a thickness of 500 nm or less.

In the above, embodiments of an OLED display device including a flexible substrate and a method for producing the same are described. The embodiments of the present invention are not limited to those described above. An embodiment of the present invention is widely applicable to an organic EL device (e.g., organic EL illumination device) including an organic EL element formed on a substrate that is not flexible (e.g., glass substrate) and a thin film encapsulation structure formed on the organic EL element.

INDUSTRIAL APPLICABILITY

An embodiment of the present invention is applicable to an organic EL device and a method for producing the same. An embodiment of the present invention is especially preferably applicable to an flexible organic EL display device and a method for producing the same.

REFERENCE SIGNS LIST 1 substrate (flexible substrate)
2 circuit (driving circuit or backplane)
3 organic EL element
4 polarizing plate
10 thin film encapsulation structure (TFE structure)
12 first inorganic barrier layer ($SiN_x$ layer)
14 organic barrier layer (acrylic resin layer)
16 second inorganic barrier layer ($SiN_x$ layer)
20 element substrate
26 acrylic monomer
26p vapor-like or mist like acrylic monomer
100, 100A organic EL display device

The invention claimed is:

1. An organic electroluminescent device, comprising:
an element substrate including a substrate and a plurality of organic electroluminescent elements supported by the substrate;
a thin film encapsulation structure formed on the plurality of organic electroluminescent elements, the thin film encapsulation structure including at least one composite stack body that includes a first inorganic barrier layer, an organic barrier layer in contact with a top surface of the first inorganic barrier layer, and a second inorganic barrier layer in contact with the top surface of the first inorganic barrier layer and a top surface of the organic barrier layer;
an organic flattening layer provided on the thin film encapsulation structure;
a touch sensor layer located on the organic flattening layer; and
a driving circuit supported by the substrate, a plurality of terminals located in a peripheral region, and a plurality of lead wires connecting the driving circuit and the plurality of terminals to each other,
wherein the thin film encapsulation structure is selectively formed at least on an active region in which the plurality of organic electroluminescent elements are located and on portions, of the plurality of lead wires, that is closer to the driving circuit, and is in contact with at least portions of the plurality of lead wires,
each of the plurality of lead wires has at least a tapering portion that has a side surface having a tapering angle smaller than 90 degrees in a cross-section of each of the lead wires that is taken along a plane parallel to a line width direction thereof, the thin film encapsulation structure includes an inorganic barrier layer joint portion where no organic barrier layer is present and the first inorganic barrier layer and the second inorganic barrier layer are in direct contact with each other, and
the inorganic barrier layer joint portion is formed on a region including the tapering portion of each of the plurality of lead wires and completely encloses the active region.

2. The organic electroluminescent device of claim 1, wherein the organic flattening layer is formed of a photosensitive resin of negative-type.

3. The organic electroluminescent device of claim 2, wherein the photosensitive resin contains a silicone resin.

4. The organic electroluminescent device of claim 2, wherein the photosensitive resin has an elastic modulus that does not exceed 400 MPa at 0° C.

5. The organic electroluminescent device of claim 1, wherein the organic flattening layer has a thickness that does not exceed 15 µm.

6. The organic electroluminescent device of claim 1, wherein the organic flattening layer has a transmittance of 80% or higher to light having a wavelength of 350 nm.

7. The organic electroluminescent device of claim 1, further comprising an inorganic insulating layer covering the organic flattening layer, wherein the touch sensor layer is formed on the inorganic insulating layer.

8. The organic electroluminescent device of claim 1, wherein the organic flattening layer covers at least the entirety of the active region in which the plurality of organic electroluminescent elements are located, and is formed in a range larger than a range of the touch sensor layer.

9. The organic electroluminescent device of claim 1, wherein the organic flattening layer covers the entirety of the element substrate.

10. A method for producing the organic electroluminescent device of claim 1, wherein a step of forming the organic flattening layer comprises:
step A of preparing the element substrate on which the thin film encapsulation structure is formed;
step B of applying a liquid containing a negative-type photosensitive resin to the element substrate such that the liquid covers at least the thin film encapsulation structure; and
step C of irradiating the entirety of the photosensitive resin on the element substrate with light.

11. The method of claim 10, wherein the step B is a step of applying the liquid to only a predetermined region on the element substrate.

12. A method for producing the organic electroluminescent device of claim 1, wherein a step of forming the organic flattening layer comprises:
step A of preparing the element substrate on which the thin film encapsulation structure is formed;
step B of applying a liquid containing a photosensitive resin to the element substrate such that the liquid covers at least the thin film encapsulation structure;
step C of selectively irradiating a portion, of the photosensitive resin, that is in a predetermined region on the element substrate or in a region other than the predetermined region, with light; and
step D of putting the photosensitive resin into contact with a developer after the step C.

* * * * *